(12) United States Patent
Wall

(10) Patent No.: US 10,270,423 B2
(45) Date of Patent: Apr. 23, 2019

(54) ELECTROMECHANICAL FREQUENCY SELECTIVE SURFACE

(71) Applicant: HRL Laboratories, LLC, Malibu, CA (US)

(72) Inventor: Walter S. Wall, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 63 days.

(21) Appl. No.: 15/283,103

(22) Filed: Sep. 30, 2016

(65) Prior Publication Data
US 2017/0099041 A1   Apr. 6, 2017

Related U.S. Application Data

(60) Provisional application No. 62/236,845, filed on Oct. 2, 2015.

(51) Int. Cl.
*H03H 9/52* (2006.01)
*H03H 9/64* (2006.01)
(Continued)

(52) U.S. Cl.
CPC ............ *H03H 9/52* (2013.01); *H01Q 1/422* (2013.01); *H01Q 15/0006* (2013.01); *H01Q 15/0026* (2013.01); *H03H 9/64* (2013.01)

(58) Field of Classification Search
CPC .......... H03H 9/54; H03H 9/0014; H03H 9/48; H01Q 15/02
(Continued)

(56) References Cited

U.S. PATENT DOCUMENTS 5,208,603 A * 5/1993 Yee ................. H01Q 1/286
                                              343/872
6,218,978 B1   4/2001 Simpkin et al.
(Continued)

FOREIGN PATENT DOCUMENTS

EP      2502306       9/2012
WO   2013054115 A1   4/2013

OTHER PUBLICATIONS

Khosravi et al., Bidirectional Same-Sense Circularly Polarized Slot Anetnna Using Polarization Converting Surface, 2014, IEEE, vol. 13, 4 pages.*

(Continued)

*Primary Examiner* — Dean O Takaoka
(74) *Attorney, Agent, or Firm* — Ladas & Parry

(57) ABSTRACT

Several embodiments are disclosed that provide for a frequency selective surface that can be placed like a radome on top of or under an existing radome or as a new radome on top of one or more radiating or receiving apertures or antennas to provide for a high-Q filter function to remove unwanted neighboring frequency interferences. The conformal structure comprises of an array of subwavelength electrically connected broken metallic rings and/or broken wires loaded with electromechanical resonators such as quartz or $LiNbO_3$ crystal resonators, Bulk Acoustic Wave (BAW) resonators, and/or Surface Acoustic Wave (SAW) resonators at said breaks. When excited by an incident electromagnetic wave this collection of loaded rings and/or wires behaves as a filter which is capable of rejecting and/or passing frequencies over a narrow bandwidth. This medium can be formed into conformal shapes which can be placed over antennas and apertures as a frequency selective material, to introduce these frequency characteristics into the radiation pattern of the antenna, thereby reducing the gain of the antenna very sharply near the outside edges of the intended operating (Continued)

band. By loading the elements of this FSS with capacitors and/or inductors, additional spectral features can be added to the frequency response of the material to introduce broad pass and reject bands, to enable additional design flexibility for shared apertures. These reject or pass bands are significantly more narrow than achievable with traditional LC loaded FSS structures.

21 Claims, 12 Drawing Sheets

(51) Int. Cl.
*H01Q 15/00* (2006.01)
*H01Q 1/42* (2006.01)
*H01Q 15/02* (2006.01)

(58) Field of Classification Search
USPC .......................................................... 333/187
See application file for complete search history.

(56) References Cited

U.S. PATENT DOCUMENTS

| | | | | |
|---|---|---|---|---|
| 7,394,334 | B2* | 7/2008 | Okano | H01P 7/082 333/134 |
| 7,741,933 | B2* | 6/2010 | Duwel | H03H 9/0095 333/186 |
| 8,514,036 | B2* | 8/2013 | McKinzie, III | H01P 1/2005 333/175 |
| 2003/0071763 | A1 | 4/2003 | McKinzie, III et al. | |
| 2008/0136563 | A1 | 6/2008 | Duwel et al. | |
| 2008/0224947 | A1 | 9/2008 | Werner et al. | |
| 2009/0125254 | A1 | 5/2009 | Kotter et al. | |
| 2009/0262766 | A1 | 10/2009 | Chen et al. | |
| 2011/0115684 | A1 | 5/2011 | Greegor et al. | |
| 2014/0293467 | A1 | 10/2014 | Palikaras et al. | |

OTHER PUBLICATIONS

From PCT/US2016/055046, International Search Report and Written Opinion dated Jan. 6, 2017.
S. Mahon and R. Aigner, "Bulk Acoustic Wave Devices—Why, How, and Where They are Going", CS MANTECH Conference, May 14-17, 2007, pp. 15-18.
M. Suarez, M. Villegas and G. Baudoin (2010). RF and Microwave Band-Pass Passive Filters for Mobile Transceivers with a Focus on BAW Technology, Advanced Microwave and Millimeter WaveTechnologies Semiconductor Devices Circuits and Systems, Moumita Mukherjee (Ed.), ISBN: 978-953-307-031-5, InTech, Available from: http://www.intechopen.com/books/advanced-microwave-and-millimeter-wavetechnologies-semiconductor-devices-circuits-and-systems/rf-and-microwave-band-pass-passive-filters-formobile-transceivers-with-a-focus-on-baw-technology.
S.M. Rudolph and W.S. Wall, "Nonlinear Multiconductor Transmission Line Analysis of Broadband Switching Metamaterials", Antennas and Propagation Society International Symposium (APSURSI), 2015 IEEE.
W.S. Wall, S.M. Rudolph, S.K. Hong, and K.L. Morgan, "Broadband Switching Nonlinear Metamaterial", IEEE Antennas and Wireless Propagation Letters, vol. 13, 2014, pp: 427-430.
Triquint 885014 2332.5 MHz BAW Filter Data Sheet: Rev A, Jun. 2, 2014.
S.M. Rudolph and A. Grbic, "The Design of Broadband, Volumetric NRI Media Using Multiconductor Transmission-Line Analysis", IEEE Transactions on Antennas and Propagation, vol. 58, No. 4, Apr. 5, 2010, pp. 1144-1154.
From PCT/US2016/055046, International Preliminary Report on Patentability (IPRP; Ch. 1) dated Apr. 12, 2018.
Varsanik, Jonathan S. *Design and Analysis of MEMS-Based Metamaterials*. Massachusetts Institute of Technology, Department of Electrical Engineering and Computer Science, Jun. 2006 (pp. 1-107).

\* cited by examiner

| L | 40 mm |
| h | 8.5 mm |
| w | 8 mm |
| T | 60 mil |
| t | 5 mil |

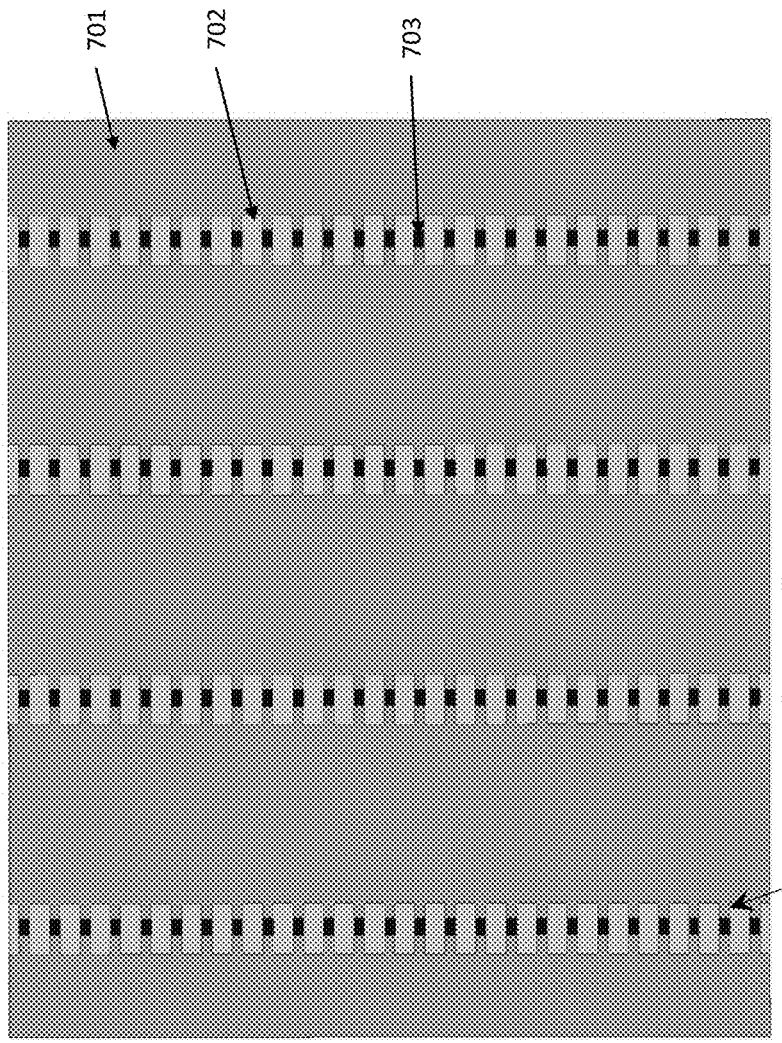
Figure 7a
Figure 7b
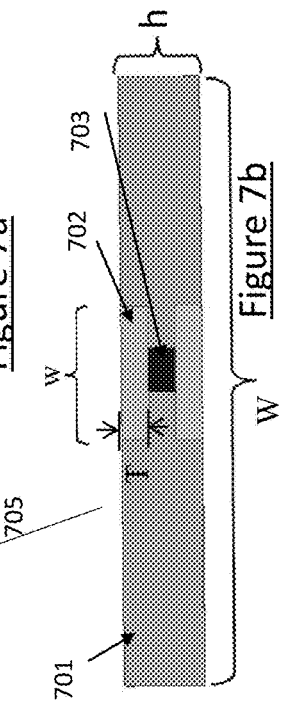
| h | 3 mm |
| w | 5 mm |
| W | 22.62 mm |
| T | 1 mm |
Figure 7c

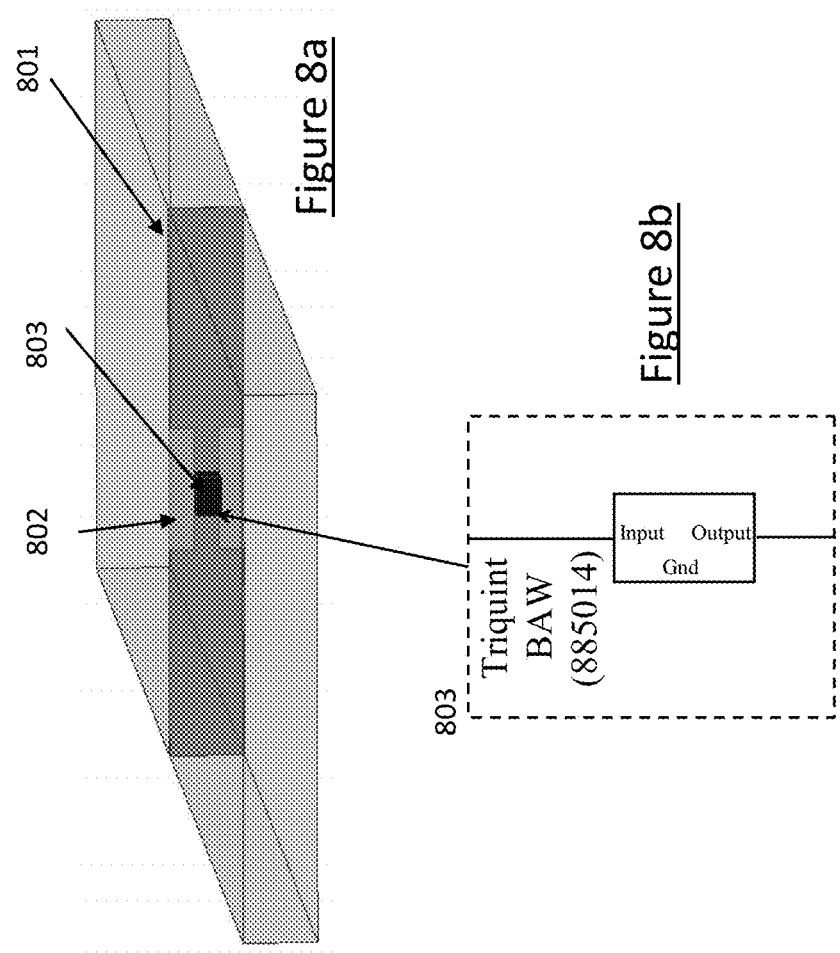

ELECTROMECHANICAL FREQUENCY SELECTIVE SURFACE

CROSS REFERENCE TO RELATED APPLICATIONS

This non-provisional application claims priority to provisional application No. 62/236,845 filed on Oct. 2, 2015.

TECHNICAL FIELD

The present disclosure is directed in general to radomes and in particular to the field of protecting communication, radar, and other receiver systems from jamming and interferences.

BACKGROUND OF THE DISCLOSURE

A variety of techniques are known to shield receivers from interference and jamming from neighboring frequencies. However, some of these include techniques that require redesign or adding or swapping of components that incur substantial replacement costs. The field is in dire need of techniques that can substantially reduce interferences in the environment without having to change the existing system and available as an 'add on' solution.

Often RF transmitters and receivers for cellular, entertainment, and navigation operate in dense and dynamic spectral environments with little frequency spacing between adjacent channels. When signals from neighboring channels are unintentionally picked up by a receiver, this creates noise and interference, degrading the performance of the receiver and the system. Due to this issue, filters to reject unwanted neighboring frequencies are an essential component of modern RF receivers. However traditional LC filters often do not have sufficient quality factors to reject unwanted signals which are very close in frequency. For many applications quality factor Q's greater than $10^2$ are required. Filters employing electromechanical resonators such as quartz and $LiNbO_3$ crystal resonators, Bulk Acoustic Wave (BAW) and Surface Acoustic Wave (SAW) resonators, can be manufactured with large quality factors ($>10^4$) and provide a solution to this problem but currently need to be integrated into the receiver before deployment. For many existing systems uninstalling or replacing the antenna and/or receiver is undesirable due to cost or efforts, demanding a High-Q retrofit filtering solution as new interference sources emerge.

Several patented technologies exist for reducing the gain of an antenna over a select range of frequencies, however these techniques all employ some form of LC resonance to create the filter properties, limiting the insertion loss and out-of-band rejection. These inventions are usually comprised of arrays of electrically conductive elements and/or packaged inductors and capacitors tuned to resonate to create band pass or band reject characteristics for incident radiation. The mechanism for creating these resonances is based on the storage of energy in inductive and capacitive components and is therefore limited by the previously mentioned quality factor constraints associated with LC resonators. Even in the field of metamaterials and Frequency Selective Surfaces (FSS), the techniques have relied solely on LC resonances, which due to their quality factors limit the achievable filter characteristics for these devices.

SUMMARY OF THE DISCLOSURE

To address one or more of the above-deficiencies of the prior art, one embodiment described in this disclosure provides for a frequency selective surface (FSS) unit cell comprising one or more substrates, one or more metallic rings and/or wires with breaks and the metallic rings or wires are mounted on the one or more substrates and one or more crystal resonators, bulk acoustic wave (BAW) resonators and/or surface acoustic wave (SAW) resonators at said breaks.

Another embodiment, according to the principles of the disclosure provides for an electromechanical FSS array comprising, two or more FSS unit cells arranged as an array on one or more substrates, wherein each FSS unit cell comprises, one or more metallic rings and/or wires with breaks and the metallic rings or wires are mounted on the substrates and one or more crystal resonators, bulk acoustic wave (BAW) resonators and/or surface acoustic wave (SAW) resonators at said breaks.

Yet another embodiment, according to the principles of the disclosure provides for an electromechanical FSS structure comprising, two or more FSS arrays stacked up as layers, wherein each array comprises, two or more FSS unit cells arranged as rows and columns on one or more substrates, wherein each FSS unit cell comprises, one or more metallic rings and/or wires with breaks and the metallic rings or wires are mounted on the substrates and one or more crystal resonators, bulk acoustic wave (BAW) resonators and/or surface acoustic wave (SAW) resonators at said breaks.

In another embodiment, according to the principles of the disclosure, discloses an electromechanical FSS array for circularly polarized waves, comprising two or more FSS unit cells in the shape of crossed dipoles arranged in rows and columns as an array, wherein the unit cells are electrically connected to each other, either directly or through one or more crystal resonators, BAW resonators and/or or SAW resonators along rows and/or columns of the array and mounted on one or more substrates that are conformally shaped.

In another embodiment, according to the principles of the disclosure, discloses an electromechanical FSS array for polarized waves, comprising two or more FSS unit cells in the shape of a metallic rings with breaks and the metallic rings are mounted on conformal substrates and one or more crystal resonators, bulk acoustic wave (BAW) resonators and/or surface acoustic wave (SAW) resonators are electrically connected across said breaks.

Certain embodiments may provide various technical features depending on the implementation. For example, a technical feature of some embodiments may include the capability to provide a high-Q spatial filter for horizontally polarized waves that can be placed over radiating apertures or antennas to sharply cut-off any adjacent frequency interferences. Other embodiments may support vertically polarized waves or circularly polarized waves and provide for a conformal high-Q spatial filter structure that can be placed as a radome over radiating apertures or antennas.

Although specific features have been enumerated above, various embodiments may include some, none, or all of the enumerated features. Additionally, other technical features may become readily apparent to one of ordinary skill in the art after review of the following figures and description.

BRIEF DESCRIPTION OF THE DRAWINGS

For a more complete understanding of the present disclosure and its features, reference is now made to the following description taken in conjunction with the accompanying drawings, in which like reference numerals represent like parts:

FIG. 7a illustrates a large array of FSS unit cells loaded with bulk acoustic wave filters, according to an embodiment of the present disclosure; FIG. 7b illustrates a close-up view of a single unit cell and FIG. 7c illustrates relevant dimensions of the same, according to an embodiment of the present disclosure;

FIG. 8a illustrates a close-up view of a single FSS unit cell loaded with a bulk acoustic wave filter, according to an embodiment of the present disclosure; FIG. 8b illustrates the adaptation of the off-the-shelf BAW in the unit cell, according to an embodiment of the present disclosure;

DETAILED DESCRIPTION

It should be understood at the outset that, although example embodiments are illustrated below, the concepts of the present disclosure may be implemented using any number of techniques, whether currently known or not. The present concepts and embodiments of this disclosure should in no way be limited to the example implementations, drawings, and techniques illustrated below. Additionally, the drawings are not necessarily drawn to scale.

To overcome the deficiencies of the prior art, the concepts disclosed herein enables FSS structures which can be placed over existing antennas or apertures as a supplemental radome to introduce narrow reject or pass bands to block interference or jamming from neighboring frequencies, using FSS structures loaded with high Q electromechanical resonators such as crystal resonators, BAW resonators or SAW devices. This narrowband FSS can also be used to reduce the radar cross section of an antenna and/or reduce unintended signatures from a transmitter by acting as a very narrowband spatial filter. The proposed techniques substantially reduce the retrofit costs as they can be used as an "add on" and do not change the existing system design. Most transmitter and receiver systems have space to add a supplemental radome on top of or under an existing radome, thus making this an easily realizable solution.

An embodiment of this invention is an array of subwavelength broken metallic rings and/or broken wires loaded with electromechanical resonators such as crystal resonators, Bulk Acoustic Wave (BAW) resonators, and/or Surface Acoustic Wave (SAW) resonators at said breaks. When excited by an incident electromagnetic wave this collection of loaded rings and/or wires behaves as a spatial filter which is capable of rejecting and/or passing frequencies over a narrow bandwidth. This medium can be formed into conformal shapes which can be placed over antennas and apertures as a frequency selective material, to introduce these frequency characteristics into the receive or transmit radiation pattern of the antenna, thereby reducing the gain of the antenna very sharply near the intended operating band and cutting off sharply the neighboring frequencies. Additionally, by loading the elements of this FSS with capacitors and/or inductors, additional spectral features can be added to the frequency response of the material, to introduce broad pass and reject bands, and to enable additional design flexibility for shared apertures.

Figure 1:
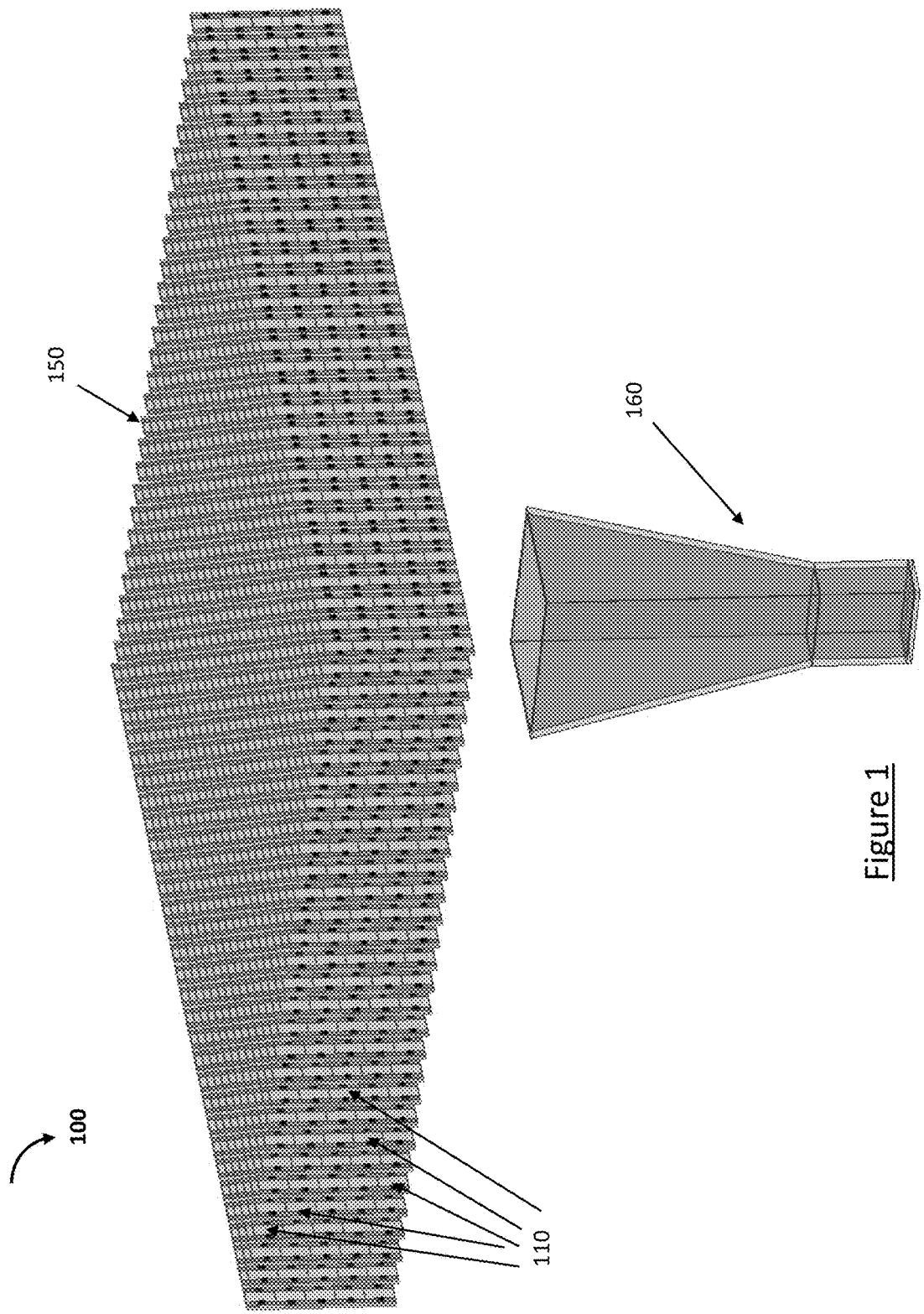
FIG. 1 illustrates a large array of traveling wave FSS unit cells loaded with bulk acoustic wave filters, formed into a slab, and placed over a pyramidal horn to act as a high-Q frequency selective surface, according to an embodiment of the present disclosure.

System 100 in FIG. 1 illustrates a large array of traveling wave metamaterial unit cells loaded with bulk acoustic wave filters, formed into a slab 150, and placed over a pyramidal horn antenna 160 to act as a high-Q frequency selective surface, according to an embodiment of the present disclosure. The Pyramidal horn 160 can be replaced with any radiating aperture or antenna. The electroacoustic metamaterial filter slab 150 comprises several layers of electroacoustic metamaterial filter layers 110 stacked up to form the slab 150. This metamaterial structure 150 loaded with BAW and/or SAW resonators introduces reject or pass bands which are significantly more narrow than those achievable with traditional LC loaded metamaterial structures.

Figures 2A, 2B, 2C:
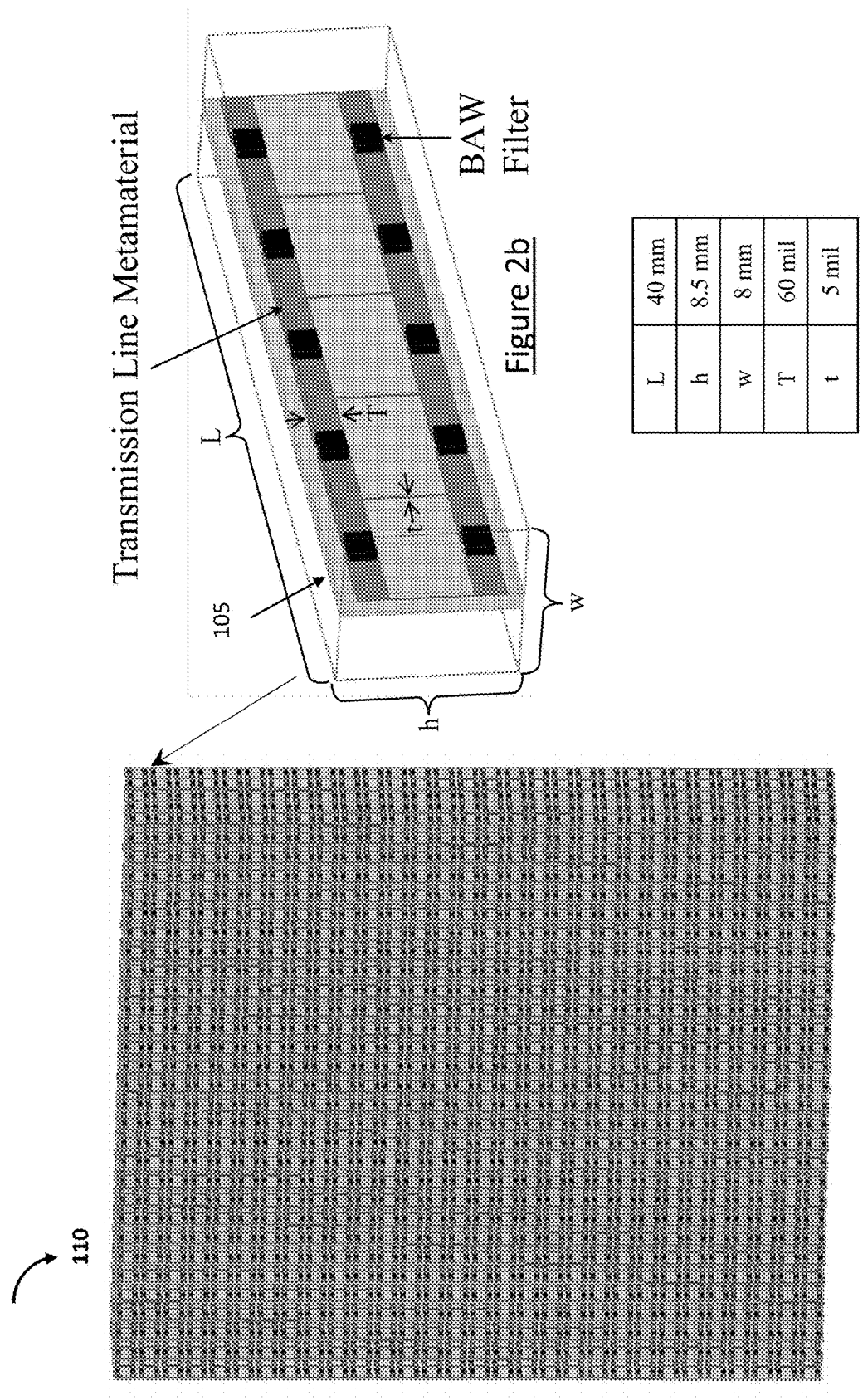
FIG. 2a illustrates a large array of traveling wave FSS unit cells loaded with bulk acoustic wave filters, according to an embodiment of the present disclosure.
FIG. 2b illustrates a close-up view of a single unit cell, according to an embodiment of the present disclosure.
FIG. 2c illustrates relevant dimensions of the unit cell, according to an embodiment of the present disclosure.
Figure 3:
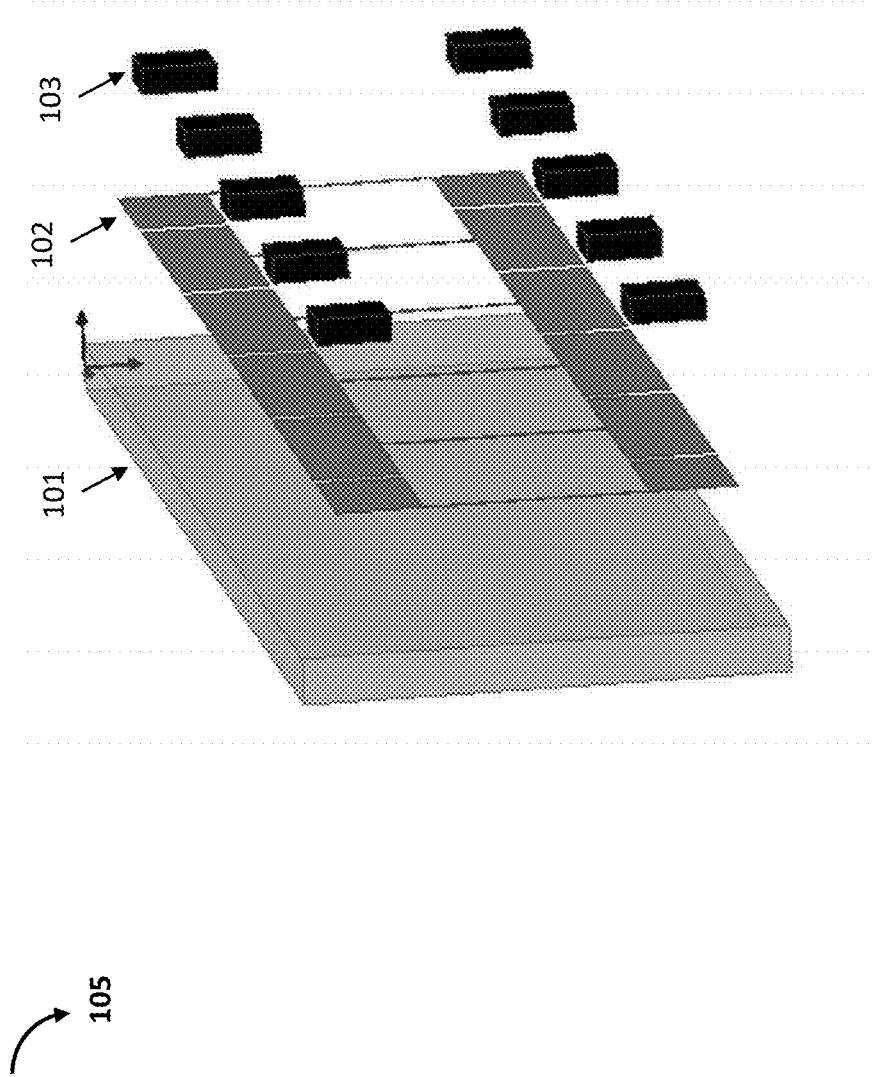
FIG. 3 illustrates an exploded view of a single traveling wave unit cell, according to an embodiment of the present disclosure.

FIG. 2a illustrates a large array of traveling wave metamaterial unit cells 105 loaded with bulk acoustic wave filters to form the filter layer 110, according to an embodiment of the present disclosure. FIG. 2c illustrates relevant dimensions of the unit cell, according to an embodiment of the present disclosure. FIG. 2b illustrates a close-up view of a single unit cell 105, according to an embodiment of the present disclosure. FIG. 3 illustrates an exploded view of a single traveling wave unit cell 105, comprised of a low loss substrate 101 on which a transmission line metamaterial 102 is mounted. The metamaterial 102 can be formed as thin long strips with one or more gaps in the transmission line. The metamaterial 102 can take on any shape, such as the shape of a crossed dipole, circular ring, any polygon shape, a ring or a wire or any combination thereof. Electromechanical resonators such as BAW and/or SAW (103) resonators are mounted in, on, and/or across these gaps, bridging the sliced metamaterial strip. Rows of these thin long strips are cascaded as needed to form the required shape for the radome.

An embodiment of this disclosure comprises of a two-dimensional array of metallic rings (110) of dimensions (as shown in FIG. 2a-2c) much less than a wavelength (<λ/4) and with center-to-center spacing much less than a wavelength (<λ/4), mounted on a low loss substrate (101) such as, but not limited to, Rogers RO4003, Rogers RO3003, or Rogers RO5880. The array and ring dimensions would be determined through analysis or experiment, and would depend on the desired electrical characteristics. Each ring or wire would have one or more gaps in the metal, whose dimensions would be determined by analysis or experiment using methods known in the art. Across each gap, or across a subset of the total number of gaps, electromechanical resonators 103 such as BAW or SAW devices would be mounted, with one end of the device electrically connected to one side of the gap and the other end of the device connected to the opposing side of the gap. By connecting the terminals of said gaps with a BAW or SAW resonator, lossy narrowband absorption features can be introduced into the effective permeability of this structure as well as over a given distance, and attenuate certain desired frequencies but allow other frequencies to pass through with less attenuation. Furthermore, by placing inductive and capacitive elements in series with the BAW resonator, this array of metallic rings allows broad band-pass or band-reject features to be introduced independently of these narrowband absorption features.

Figure 4:
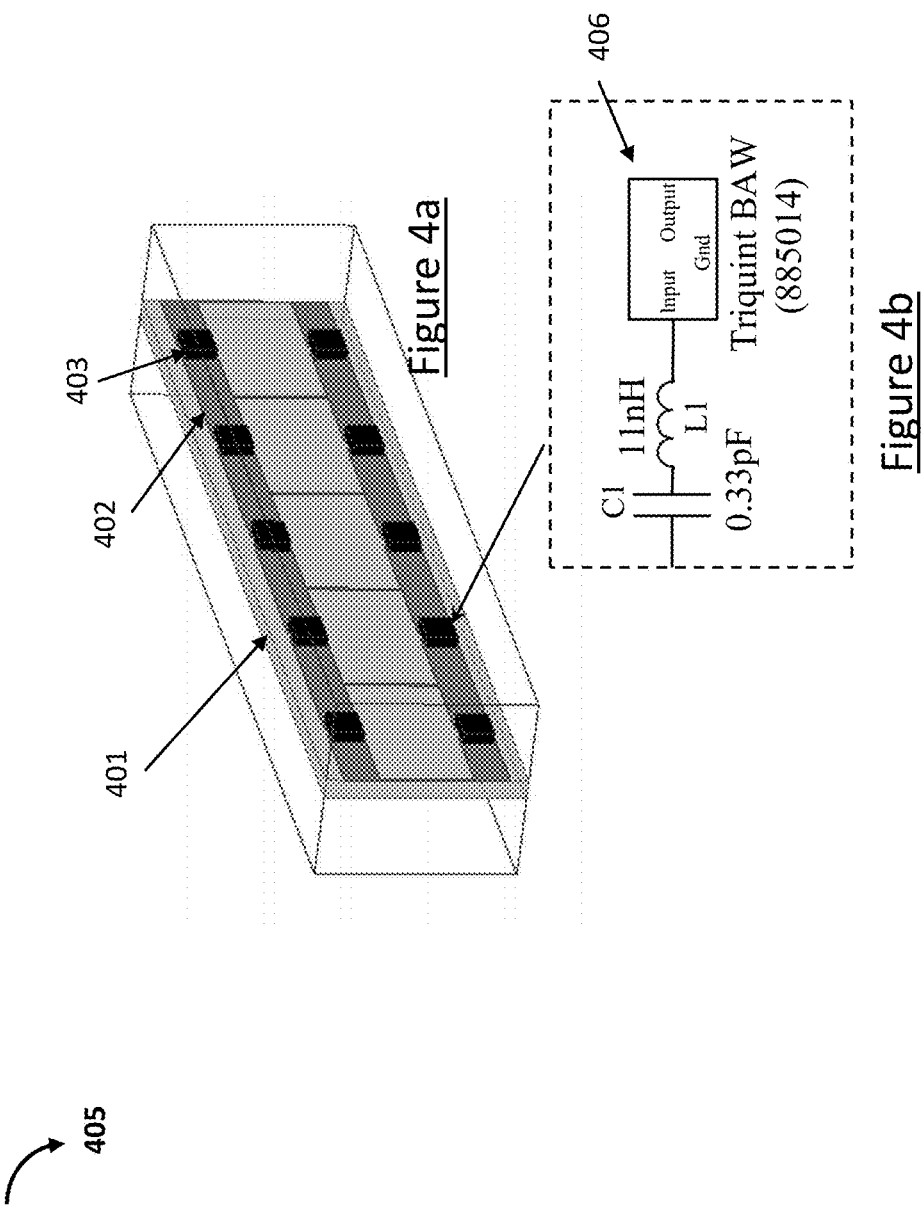
FIG. 4a illustrates a close-up view of a single traveling wave unit cell, according to an embodiment of the present disclosure.
FIG. 4b illustrates the use of an off-the-shelf bulk acoustic wave (BAW) filter and 0.33 pF capacitor, according to an embodiment of the present disclosure.

Another embodiment of the present disclosure uses unit cell 405 as illustrated in FIG. 4a that uses an off-the-shelf Triquint BAW (406) along with a capacitor and inductor as the electroacoustic resonator 403 mounted on the breaks along a transmission line 402 on top of a low loss substrate 401, as illustrated in FIGS. 4a and 4b. One can add additional components to tune the performance and the bands of interest to meet the application needs.

Figure 5:
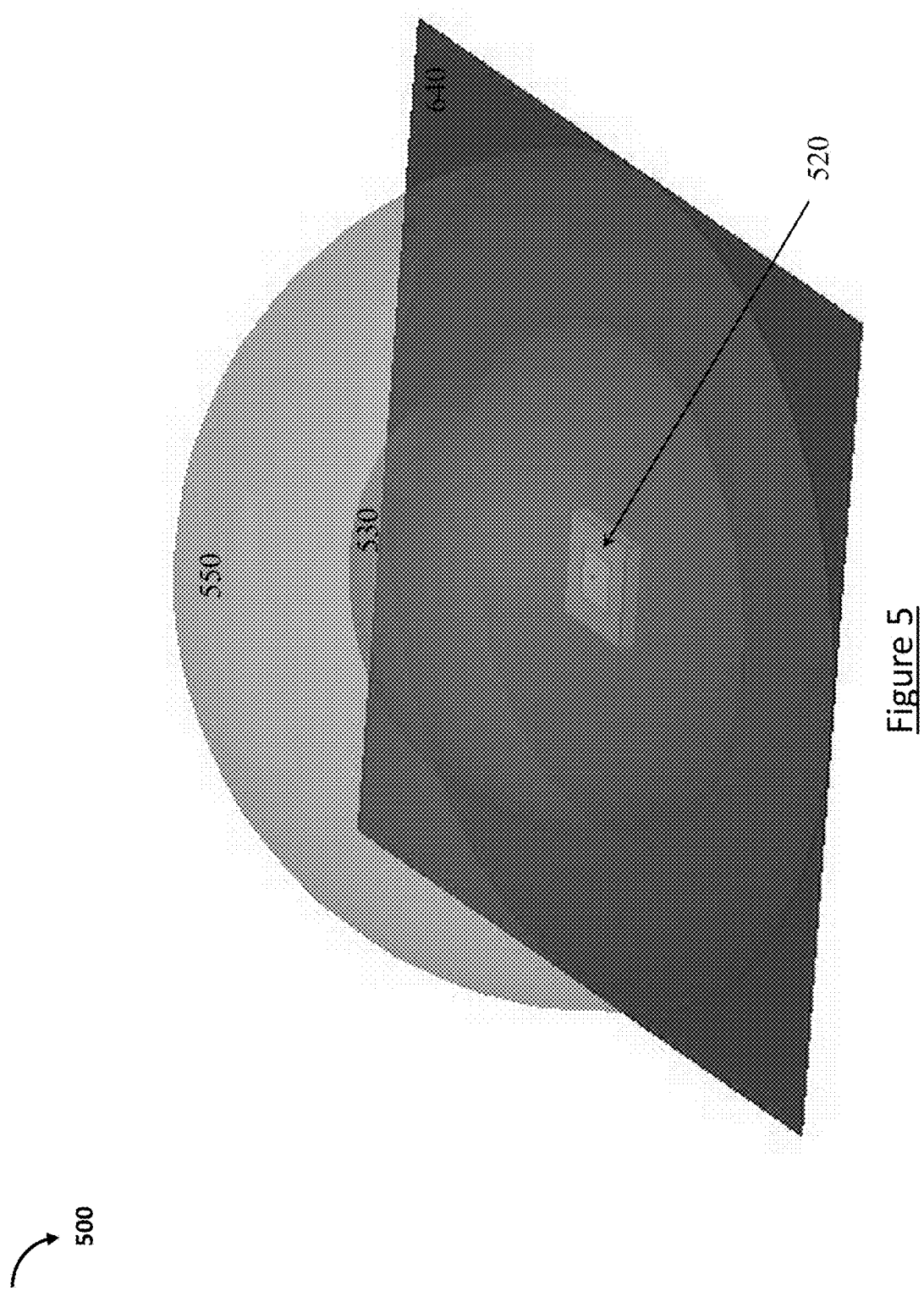
FIG. 5 illustrates geometry for 200 mm diameter and 40 mm thick dielectric sphere having the same effective material parameters as the FSS unit cell in FIG. 4a, and placed over a SDARS patch antenna on an infinite ground plane, according to an embodiment of the present disclosure.

System 500 illustrated in FIG. 5 is structured, according to an embodiment of the present disclosure, to meet the needs of this FSS structure on an existing antenna. FIG. 5 illustrates an inner hemisphere 530 and an outer hemisphere 550—having the same effective material properties (permittivity and permeability) as the previously described metamaterial unit cell 405, and placed over an SDARS patch antenna 520. The geometry for the dielectric sphere 530-550 is 200 mm diameter and 40 mm thick. The effective permittivity and permeability for this hemisphere 530-550 can be designed to yield the effective permeability of around 3.5 in the band 2.3 to 2.4, while the permittivity can be designed to be stable around 0.6 to 0.7 in the same frequency window.

Figure 6:
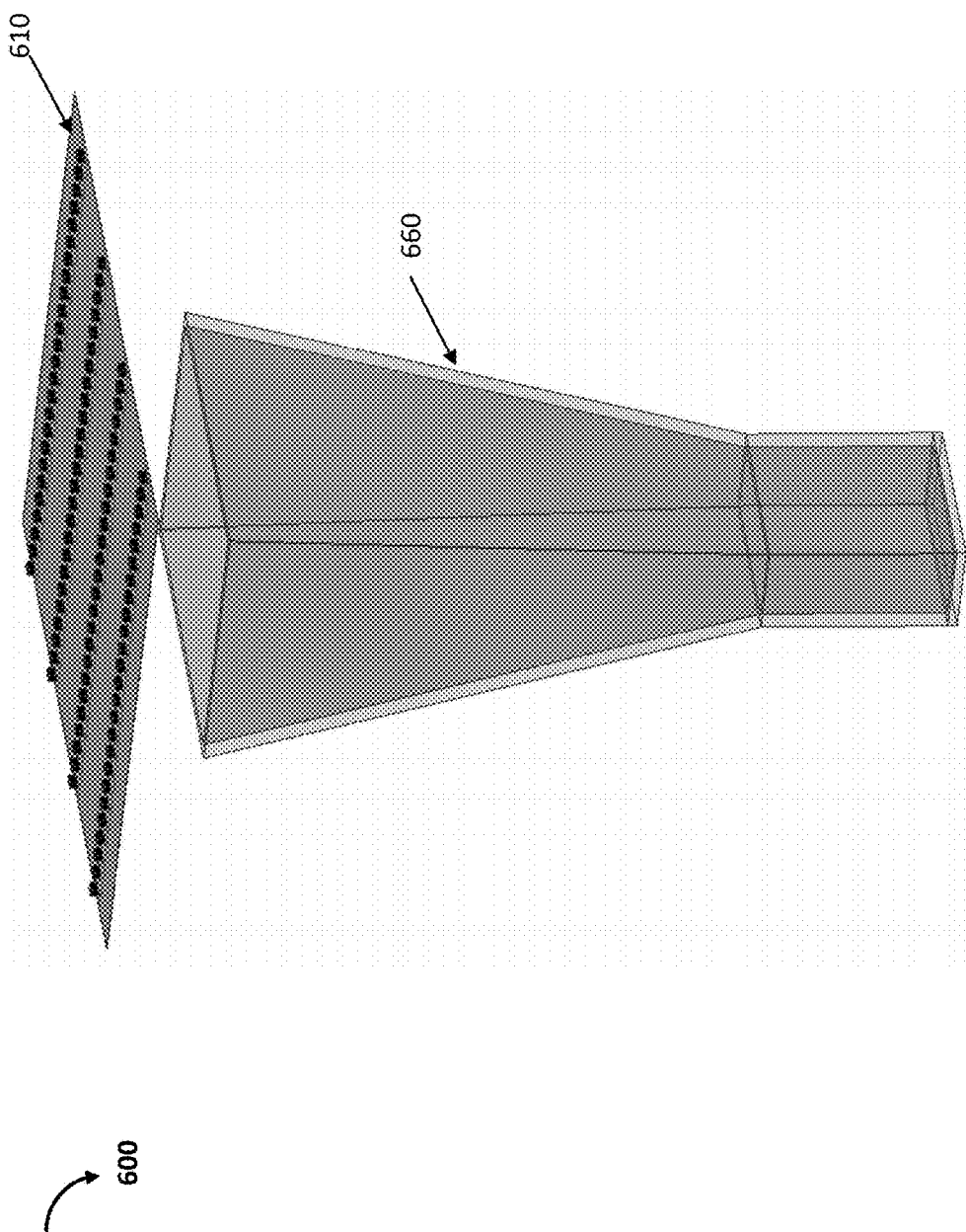
FIG. 6 illustrates an array of FSS unit cells loaded with bulk acoustic wave filters, formed into a thin sheet, and placed over a pyramidal horn to act as a high-Q frequency selective surface, according to an embodiment of the present disclosure.

In embodiment 600 according to the present disclosure and as illustrated in FIG. 6, the electromechanical FSS 610, formed into a thin sheet, is comprised of metallic wires or strips of dimensions much less than a wavelength (<λ/4) and with center-to-center spacing much less than a wavelength (<λ/4), mounted on a thin low loss substrate, such as but not restricted to Polyethylene Terephthalate (PET) or Kapton and placed over a horn antenna 960 (FIG. 6) to function as a high-Q frequency selective surface. The horn antenna 660 can be replaced with any other type of antenna or any radiating aperture. The size of the array 610 and wire dimensions would be determined through analysis or experiment, and would depend on the desired electrical characteristics and can be molded into any shape to conform to a radome. Each wire would have one or more gaps in the metal, whose dimensions would be determined by analysis or experiment using methods known in the art. Across each gap, or across a subset of the total number of gaps, electromechanical resonators such as crystal resonators, BAW resonators, or SAW resonators would be mounted, with one end of the device electrically connected to one side of the gap and the other end of the device connected to the opposing side of the gap. By connecting the terminals of said gaps with a crystal resonator, BAW resonator, or SAW resonator, high Q features can be introduced into the of this structure spanning over a given frequency range, and attenuate certain desired frequencies but allow other frequencies to pass through with less attenuation.

Figure 9:
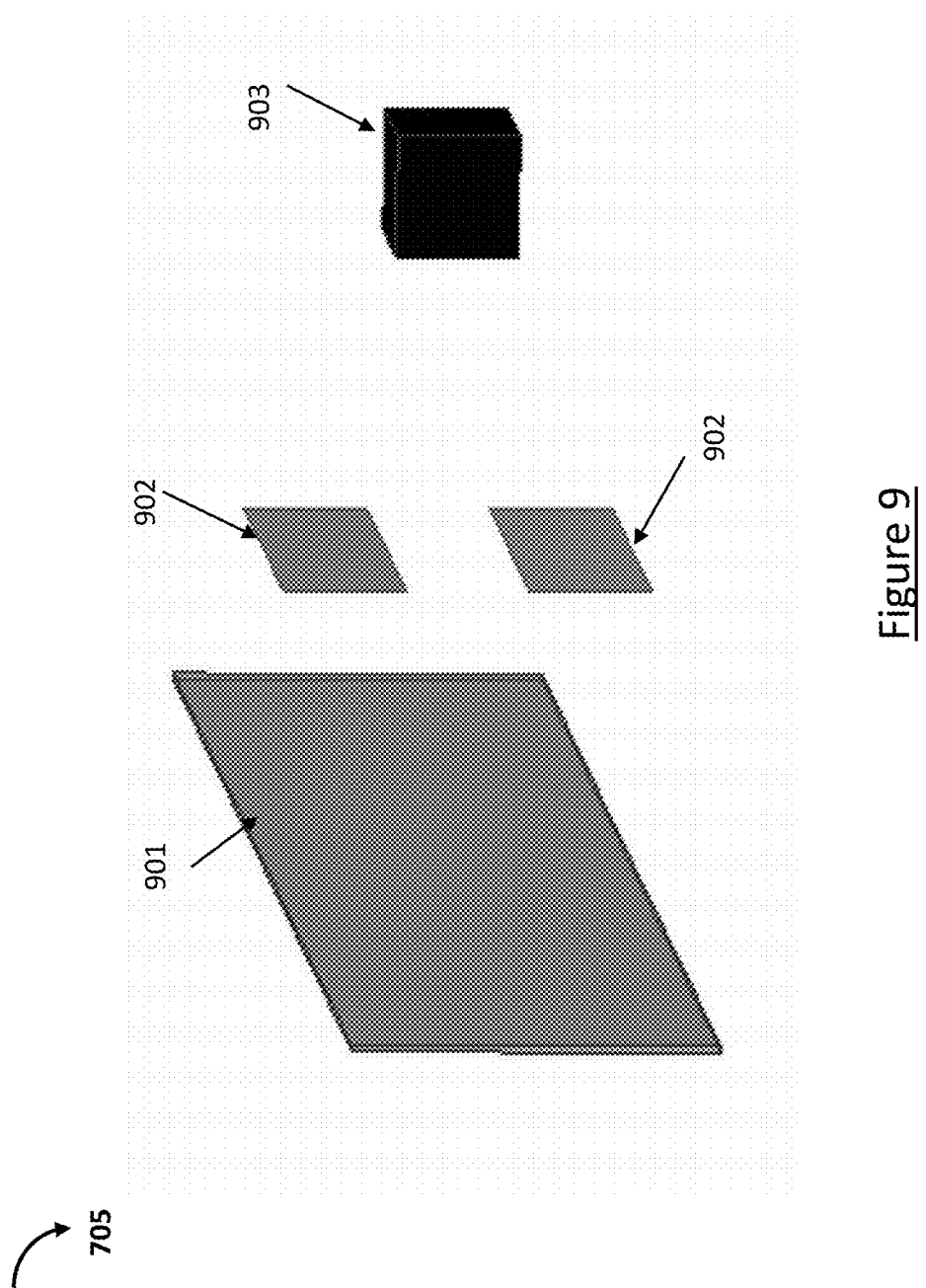
FIG. 9 illustrates an exploded view of the unit cell in FIG. 8a, according to an embodiment of the present disclosure.
Figure 10:
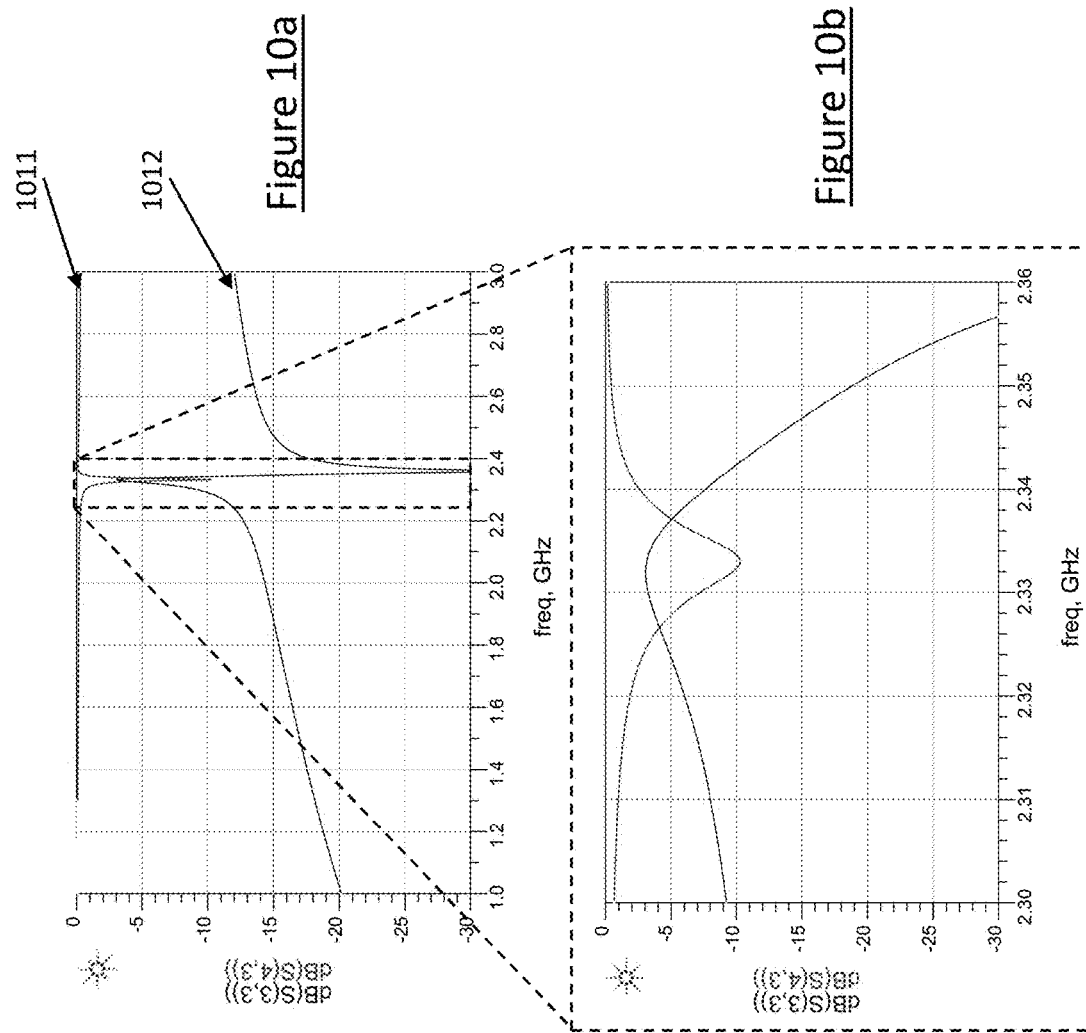
FIG. 10a and FIG. 10b illustrate simulated transmission and reflection measurements, for an incident plane wave, according to an embodiment of the present disclosure.

An electromechanical FSS 710, in FIGS. 7a, 7b and 7c illustrate another embodiment according to the present disclosure. FIGS. 8a and 8b illustrate the specific variant with the Triquint 885014 BAW filter as the resonator 703. In the FIG. 8a, 801 is a low loss substrate, 802 is a slice of a metamaterial strip and 803 is the resonator that uses the Triquint 885124 BAW filter part. FIG. 9 illustrates the exploded view of the unit cell 705. In the FIG. 9, 901 is a low loss substrate, 902 is a slice of a metamaterial strip and 803 is a BAW or a SAW resonator. The 22.624 mm×3 mm unit cell 705 is illustrated FIG. 7b. The array 710 was simulated in Ansoft's HFSS simulation station. A 5 mm metallic sheet 702 with a 1 mm gap was mounted on a low loss substrate 701 and in the middle of the unit cell and loaded with a resonator, such as the off-the-shelf Triquint 885014 BAW (703). The substrate 701 for this unit cell was 2 mil Kapton. Once again the ground terminals of the filter were open circuited. As shown in FIGS. 10a and 10b, this structure exhibits a narrowband-reject feature centered at 2.332 GHz. Plot 1011 in FIGS. 10a and 10b illustrates transmission characteristics while plot 1012 is reflection characteristics for an incident plane wave. Beyond 2.5 GHz, relatively good transmission is seen (>1 dB). Furthermore, below 2.3 GHz this structure exhibits less than 1 dB transmission loss.

Figure 11:
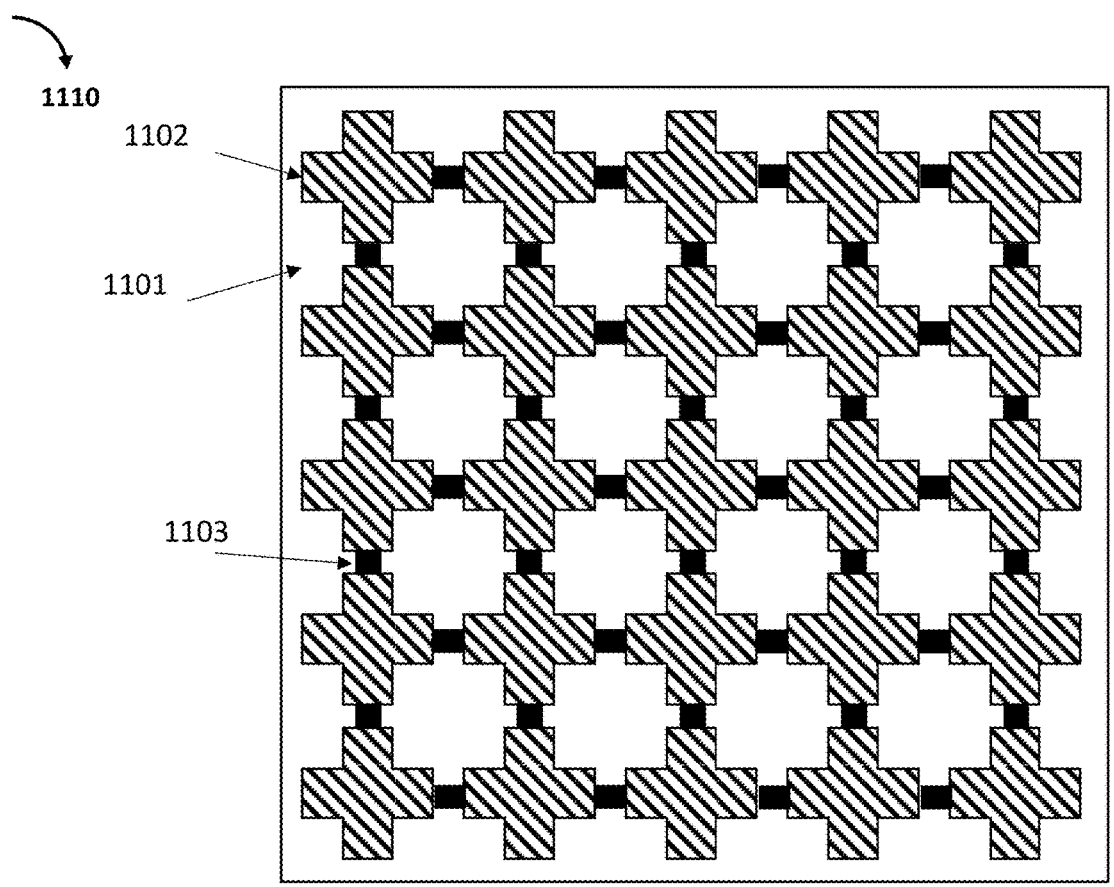
FIG. 11 illustrates a circularly polarized electromechanical FSS, according to an embodiment of the present disclosure.

Array 1110 in FIG. 11 illustrates a circularly polarized electromechanical FSS, according to an embodiment of the present disclosure. The metal trace 1102 takes the shape of a crossed dipole and is coupled to neighboring dipoles through electromechanical filter elements 1103 that can include crystal resonators, BAW resonators and SAW resonators. The substrate 1101 can be a thin sheet of 2 mil Kapton or any other low loss dielectric substrate. Array 1110 has similar performances as in 705, but for a circular polarization wave.

Figure 12:
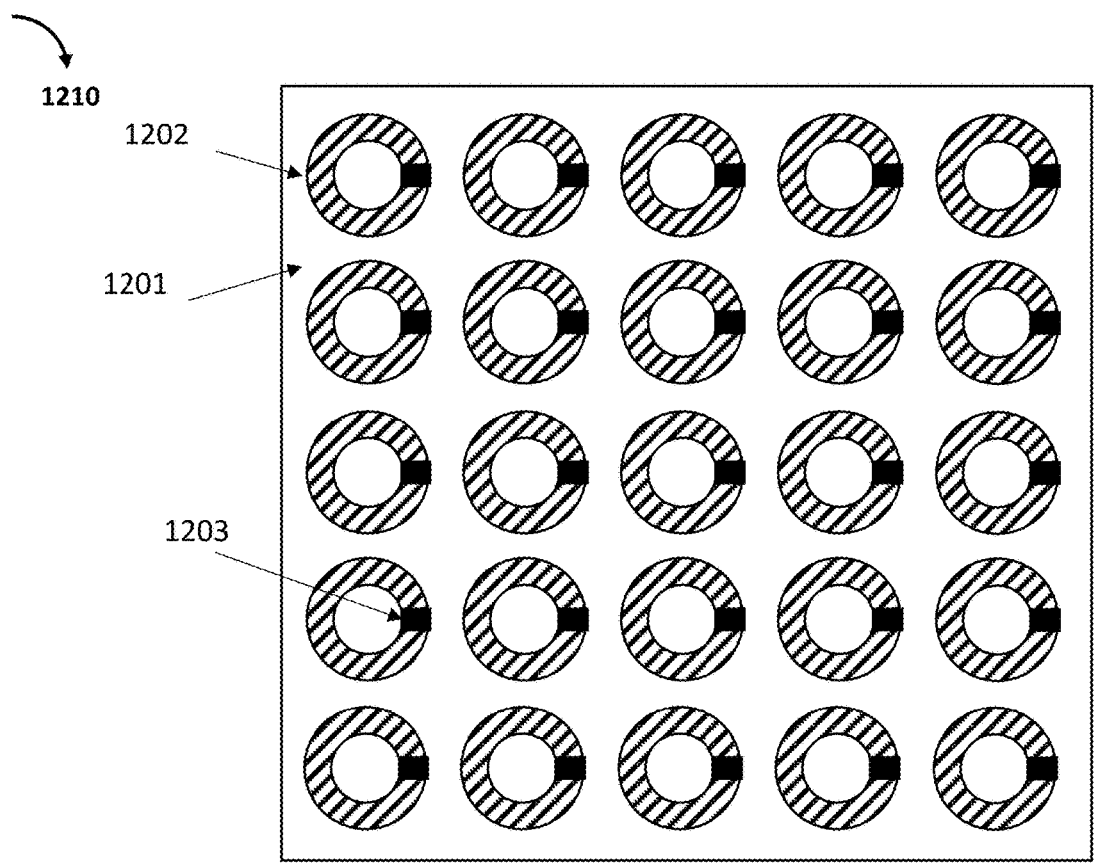
FIG. 12 illustrates electromechanical FSS utilizing broken metallic rings, according to an embodiment of the present disclosure.

Array 1210 in FIG. 12 illustrates a polarized electromechanical FSS, according to an embodiment of the present disclosure. The metal trace 1202 takes the shape of a broken metallic ring that can include crystal resonators, BAW resonators, and SAW resonators. The substrate 1201 can be a thin sheet of 2 mil Kapton or any other low loss dielectric substrate. Simulations indicate similar performances as in 705.

Though in many embodiments Triquint BAW resonators were illustrated and used in the simulations, the concept includes any crystal resonator, BAW resonator, or SAW resonator with or without external capacitor—inductor pair in its place. The disclosed embodiments are also of significant value to the automotive industry, which currently has no good solution to reduce interference from Wireless Communication Services (WCS) transmitters interfering with currently installed XM receivers. Furthermore, this technology may also have value for aircraft manufacturers as well as the Department of Defense, which commonly employ frequency selective surfaces on antennas for radar and sensing applications. By improving the filtering characteristics of the FSS using high Q electromechanical resonators, this invention can improve the tactical function of current frequency selective surfaces.

It must be noted that though the word FSS (Frequency Selective Surface) was used interchangeably with the word metamaterials in this disclosure, a wide variety of metamaterials as well as materials identified in the art as FSS can provide similar performances as described herein and this disclosure includes all such materials.

In particular configurations, it may be desirable to have a thin sheet array 710 of electromechanical FSS as illustrated in FIG. 7*a*. In other configurations, a three-dimensional thick slab type structure where several array layers are stacked up, such as the one illustrated in system 100 may be better suited. Any and all of these FSS structures can be molded conformally to adopt to the space above the antenna to form an add-on radome, being placed either over or under existing radomes—or as standalone radomes over any radiating apertures or antennas.

In particular configurations, it may be desirable to have broken metallic wires in the place of one or more broken metallic rings as transmission media on the electromechanical FSS unit cells. Crystal resonators, BAW resonators, and/or SAW resonators can be mounted on one or more breaks in the wires similar to the mounting on the broken rings. In some configurations, the electromechanical FSS may have just broken wires and crystal resonators, SAW resonators, or BAW resonators mounted on the breaks in the wires. In other configurations, the transmission media may have a combination of broken metallic rings and broken metallic wires. These arrays can be stacked up to form a three-dimensional electromechanical FSS structure that are conformal. All of these electromechanical FSS arrays and structures can be molded conformally to adopt to the space above the antenna to form an add-on radome, being placed either over or under existing radomes—or as standalone radomes over any radiating aperture.

In particular configurations, it may be desirable to have just one substrate for an array where all FSS unit cells in the array are mounted monolithically on the same substrate. In other configurations, it may be desirable to use more than one substrate inside a unit cell or inside of an array of FSS unit cells. In a three-dimensional FSS structure, in particular configurations, it may be desirable to use the same substrate material for all layers. In other configurations, it may be desirable to use more than one substrate insides the three-dimensional FSS structure.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A Frequency Selective Surface (FSS) comprising:
a unit cell comprising:
a substrate;
a metallic trace with a break that is mounted on the substrate; and
a first resonator spanning the break that is electrically connected to the metallic trace, the resonator including at least one of: a quartz or $LiNbO_3$ crystal resonator and a bulk acoustic wave (BAW) resonator.

2. The FSS of claim 1, wherein the metallic trace of the unit cell has the shape of a polygon, crossed dipole, circular ring, or a wire.

3. The FSS of claim 1, wherein the substrate of the unit cell is selected from Polyethylene Terephthalate (PET), Kapton Rogers RO4003, Rogers RO3003, and Rogers RO5880.

4. The FSS of claim 1, wherein the unit cell further comprises a capacitor and an inductor, wherein the capacitor and the inductor are placed in series with the first resonator of the unit cell when connecting the break in the metallic trace.

5. The FSS of claim 1, wherein the substrate of the unit cell and the unit cell are shaped conformally.

6. The FSS of claim 1, wherein the unit cell further comprises a second resonator mounted in parallel with the first resonator.

7. The FSS of claim 1, wherein the metallic trace of each FSS unit cell has extremities electrically connected to the first resonator, wherein the extremities have a width larger than a width of the first resonator.

8. The FSS of claim 7, wherein the first resonator is a surface acoustic wave (SAW) resonator.

9. An electromechanical frequency selective surface (FSS) comprising:
a radome;
an array of two to more FSS unit cell disposed along the radome, wherein each FSS unit cell comprises:
a substrate;
a metallic trace with a gap that is mounted on the substrate; and
a first resonator spanning the gap that is electrically connected to the metallic trace, the resonator including at least one of: a quartz or $LiNbO_3$ crystal resonator and a bulk acoustic wave (BAW) resonator.

10. The electromechanical FSS of claim 9, wherein the metallic trace of each FSS unit cell has the shape of a polygon, crossed dipole, circular ring, or a wire.

11. The electromechanical FSS of claim 9, wherein the substrate of each FSS unit cell is selected from Polyethylene Terephthalate (PET), Kapton Rogers RO4003, Rogers RO3003, and Rogers RO5880.

12. The electromechanical FSS of claim 9, wherein each FSS unit cell further comprises a capacitor and an inductor, wherein the capacitor and the inductor are placed in series with the first resonator when connecting the gap in the metallic trace.

13. The electromechanical FSS of claim 9, wherein the array of the two or more FSS unit cells is shaped conformally to form the radome.

14. The electromechanical FSS of claim 9, wherein each unit cell further comprises a second resonator mounted in parallel with the first resonator.

15. A Frequency Selective Surface (FSS) structure comprising:
two or more FSS arrays of FSS unit cells stacked as layers, wherein each array of FSS unit cells comprises:

two or more FSS unit cells, wherein each FSS unit cell comprises:
a substrate;
a metallic trace with a gap that is mounted on the substrate; and
a first resonator spanning the gap that is electrically connected to the metallic trace, the resonator including at least one of a quartz or $LiNbO_3$ crystal resonators and a bulk acoustic wave (BAW) resonator.

16. The FSS structure of claim 15, wherein each FSS unit further comprises a capacitor and an inductor, wherein the capacitor and the inductor are placed in series with the first resonator when connecting the gap in the metallic trace.

17. The FSS structure of claim 15, wherein the two or more FSS arrays of FSS unit cells are shaped conformally to form a radome.

18. The FSS structure of claim 15, wherein the two or more FSS unit cells of each array of FSS unit cells are arranged as rows and columns and are electrically connected to each other.

19. A frequency selective surface comprising:
a substrate;
a plurality of metallic rings disposed on the substrate, wherein each ring includes a gap such that each ring is a broken ring; and
a plurality of resonators, each resonator being located in a gap defined by a metallic ring, each resonator being electrically connected to a metallic ring,
wherein the positioning of resonators in conjunction with the shaping of the metallic rings enables the selection of frequency.

20. A frequency selective surface, comprising:
a substrate;
a plurality of metallic traces disposed on the substrate; and
a plurality of resonators, wherein the resonators include at least one of: a quartz or $LiNbO_3$ crystal resonator, a bulk acoustic wave (BAW) resonator, and a surface acoustic wave (SAW) resonator,
wherein each metallic trace includes a break thereby forming two ends of the metallic trace which define the break,
wherein each resonator of the plurality of resonators is associated with a break and electrically connects one end to the other end of the two ends.

21. The frequency selective surface of claim 20, wherein the substrate is monolithic.

* * * * *